United States Patent
Yamamoto et al.

(10) Patent No.: US 7,478,609 B2
(45) Date of Patent: Jan. 20, 2009

(54) PLASMA PROCESS APPARATUS AND ITS PROCESSOR

(75) Inventors: Naoko Yamamoto, Osaka (JP); I'atsushi Yamamoto, Nara (JP); Masaki Hirayama, Sendai (JP); I'adahiro Ohmi, Sendai (JP)

(73) Assignees: Sharp Kabushiki Kaisha, Osaka-shi (JP); Tadahiro OHMI, Miyagi (JP)

( * ) Notice: Subject to any disclaimer, the term of this patent is extended or adjusted under 35 U.S.C. 154(b) by 64 days.

(21) Appl. No.: 10/494,562

(22) PCT Filed: Oct. 11, 2002

(86) PCT No.: PCT/JP02/10635

§ 371 (c)(1),
(2), (4) Date: May 6, 2004

(87) PCT Pub. No.: WO03/041460

PCT Pub. Date: May 15, 2003

(65) Prior Publication Data

US 2005/0011455 A1     Jan. 20, 2005

(30) Foreign Application Priority Data

Nov. 8, 2001   (JP)   ............................. 2001-342857

(51) Int. Cl.
*C23C 16/00*   (2006.01)
*C23F 1/00*    (2006.01)
*H01L 21/306*  (2006.01)

(52) U.S. Cl. ................... 118/723 MW; 156/345.36; 156/345.41; 156/345.42; 156/345.46; 156/345.49

(58) Field of Classification Search ......... 118/723 MW; 156/345.36, 345.41
See application file for complete search history.

(56) References Cited

U.S. PATENT DOCUMENTS

| | | | | | |
|---|---|---|---|---|---|
| 5,038,712 | A | * | 8/1991 | Fujiyama | ............ 118/723 MW |
| 5,589,007 | A | * | 12/1996 | Fujioka et al. | .............. 136/249 |
| 5,597,623 | A | * | 1/1997 | Takai et al. | .................. 427/575 |
| 5,804,033 | A | * | 9/1998 | Kanai et al. | .................... 216/69 |
| 5,955,382 | A | | 9/1999 | Yamauchi et al. | |

(Continued)

FOREIGN PATENT DOCUMENTS

EP        0 791 949 A2    8/1997

(Continued)

*Primary Examiner*—Parviz Hassanzadeh
*Assistant Examiner*—Rakesh K Dhingra
(74) *Attorney, Agent, or Firm*—Birch, Stewart, Kolasch & Birch, LLP

(57) ABSTRACT

A plasma processing apparatus and a processing apparatus having a widened process condition range allowing plasma generation are obtained by increasing microwave propagation efficiency. The plasma processing apparatus includes a processing chamber where plasma processing is performed, and microwave introducer for introducing microwaves into the processing chamber. The microwave introducer includes a dielectric member transmitting the microwaves. The dielectric member has a shape in cross section in a direction approximately perpendicular to a transmitting direction of the microwaves through the dielectric member that allows transmission of the microwaves of substantially a single mode. The dielectric member has a thickness T in the transmitting direction that satisfies a condition of $(\lambda \times (2m+0.7)/4) \leq T \leq (\lambda \times (2m+1.3)/4)$, where $\lambda$ is a wavelength of the microwaves of the single mode transmitted through the dielectric member and m is an arbitrary integer.

7 Claims, 7 Drawing Sheets

U.S. PATENT DOCUMENTS

| | | | |
|---|---|---|---|
| 6,059,922 | A | 5/2000 | Yaazaki et al. |
| 6,541,982 | B2 * | 4/2003 | Kitagawa et al. ............ 324/464 |
| 6,823,816 | B2 * | 11/2004 | Ishii et al. ........... 118/723 MW |
| 2001/0050059 | A1 | 12/2001 | Hongo et al. |
| 2002/0020498 | A1 | 2/2002 | Ohmi et al. |

FOREIGN PATENT DOCUMENTS

| | | |
|---|---|---|
| JP | 5-275196 A | 10/1993 |
| JP | 8-315998 A | 11/1996 |
| JP | 9-69398 A | 3/1997 |
| JP | 9-289099 A | 11/1997 |
| JP | 10-199698 A | 7/1998 |
| JP | 10-255999 A | 9/1998 |
| JP | 11-45799 A | 2/1999 |
| JP | 2001-176697 A | 6/2001 |
| JP | 2001-274149 A | 10/2001 |
| JP | 2001-338918 A | 12/2001 |
| JP | 2002-170818 A | 6/2002 |
| JP | 2002-176042 A | 6/2002 |

* cited by examiner

PLASMA PROCESS APPARATUS AND ITS PROCESSOR

TECHNICAL FIELD

The present invention relates to a plasma processing apparatus and a processing apparatus, and more particularly to a plasma processing apparatus and a processing apparatus utilizing microwaves.

BACKGROUND ART

Conventionally, plasma processing apparatuses utilizing plasma have been used in manufacturing processes of semiconductor devices and liquid crystal display devices to perform film deposition, etching or the like on substrates thereof. In recent years, with a considerable increase in size of the substrates of the semiconductor devices and the liquid crystal display devices, plasma processing apparatuses capable of processing large-area substrates have been developed. Particularly, with advancement in studies of the use of a rectangular substrate having a size of no smaller than one square meter for the liquid crystal display device, a plasma processing apparatus capable of processing such a large-size substrate has been developed. One of the most critical issues for the plasma processing apparatus of this kind is to improve uniformity and controllability of the process, or, to improve uniformity and controllability of the plasma.

An inductively-coupled plasma source and a plasma source utilizing microwaves provide a greater degree of freedom in process control, compared to a capacitively-coupled plasma source primarily used conventionally, since the plasma source and the biased state of the substrate can be controlled independently from each other. Thus, from the standpoints of uniformity and controllability of the process described above, the inductively-coupled plasma source and the plasma source utilizing the microwaves have come to be widely used, replacing the conventionally used capacitively-coupled plasma source.

In the plasma sources as described above, however, a dielectric member such as a dielectric window is used for supplying energy for plasma generation into a processing chamber where plasma processing is to be performed. This requires appropriate setting of shape and size of the dielectric member in order to efficiently supply the energy into the processing chamber. Particularly in the case of electromagnetic waves of short wavelengths such as microwaves, whose wavelength is sufficiently small compared to the size of the processing chamber, the size of the dielectric member as well as the mode of the microwaves transmitted through the dielectric member would largely affect efficiency in propagation of the microwaves. The propagation efficiency of the microwaves affects generation efficiency of the plasma. In other words, it affects the range of process conditions enabling plasma generation.

A technique of defining a size of the dielectric member to optimize the propagation efficiency of the microwaves is disclosed, e.g., in Japanese Patent Laying-Open No. 8-315998. The publication describes that transmission efficiency of the microwaves in a dielectric microwave transmitting member is optimized by setting the plate thickness of the microwave transmitting member to an integer multiple of approximately half the wavelength of the microwaves within the microwave transmitting member.

A technique taking account of a mode of microwaves to generate uniform plasma is disclosed, e.g., in Japanese Patent Laying-Open No. 5-275196. In this publication, it is described that a mode filter is used to restrict the number of propagation modes of microwaves having a plurality of modes including a higher order mode, to thereby obtain microwaves of substantially a single mode, which is then used to generate uniform plasma.

The conventional techniques described above, however, pose the following problems.

In the technique disclosed in Japanese Patent Laying-Open No. 8-315998, the plate thickness of the microwave transmitting member is set to an integer multiple of approximately half the wavelength of the microwaves, as described above. In the publication, quartz is shown as a material of the microwave transmitting member, and a wavelength of microwaves within a free space, taking account of a relative dielectric constant of the quartz, is used as the wavelength of the microwaves within the microwave transmitting member of quartz. The microwave transmitting member, however, has a finite size, and thus, the wavelength of the microwaves propagating through the microwave transmitting member becomes longer than the wavelength of the microwaves propagating through the free space. Further, the wavelength of the microwaves propagating through the microwave transmitting member changes according to the mode and shape of the microwaves. It is considered that it would be difficult to effectively optimize the propagation efficiency of the microwaves with the technique disclosed in Japanese Patent Laying-Open No. 8-315998 that gives no consideration to the above-described points.

In Japanese Patent Laying-Open No. 5-275196, the number of propagation modes of microwaves having a plurality of modes including a higher order mode is restricted so as to generate plasma using microwaves of substantially a single mode, as described above. However, the publication describes that the microwaves are made to have substantially a single mode within a waveguide through which the microwaves propagate. It gives no specific consideration to the mode of the microwaves within a member made of a dielectric through which the microwaves propagate. It is thus considered that there would be cases where it is difficult to effectively improve the propagation efficiency of the microwaves within the dielectric member.

The present invention has been made to solve the above-described problems by providing a plasma processing apparatus and a processing apparatus capable of widening a process condition range enabling plasma generation by increasing propagation efficiency of microwaves.

DISCLOSURE OF THE INVENTION

The plasma processing apparatus according to an aspect of the present invention is a plasma processing apparatus having a processing chamber for performing processing using plasma therein and microwave introduction means for introducing microwaves into the processing chamber to cause a reactant gas supplied in the processing chamber to attain a plasma state. The microwave introduction means includes a dielectric member transmitting the microwaves. The dielectric member has a shape in cross section in a direction approximately perpendicular to a transmitting direction of the microwaves therethrough that allows transmission of the microwaves of substantially a single mode. The dielectric member has a thickness T in the transmitting direction that satisfies a condition of $(\lambda \times (2m+0.7)/4) \leq T \leq (\lambda \times (2m+1.3)/4)$, where $\lambda$ is a wavelength of the microwaves of the single mode transmitted through the dielectric member and m is an arbitrary integer.

With this configuration, transmission efficiency of the microwaves in the dielectric member can be made sufficiently high. As such, the microwaves can be introduced into the processing chamber via the dielectric member more efficiently than conventional even if a microwave generator having performance of a conventional level is employed. As a result, it is readily possible to generate plasma under the condition that a pressure of a reactant gas for generating plasma within the processing chamber is decreased than conventional (i.e., under the condition where plasma generation would conventionally be difficult). Further, since the transmission efficiency of the microwaves in the dielectric member is improved, plasma can be generated in the processing chamber even if power of the microwaves propagating in the dielectric member is reduced than conventional. Accordingly, it is possible to widen the range of process conditions for plasma generation, such as the gas pressure and the microwave power, compared to the conventional case.

If the thickness T of the dielectric member does not satisfy the above-described condition of $(\lambda \times (2m+0.7)/4) \leq T \leq (\lambda \times (2m+1.3)/4)$, the transmission efficiency of the microwaves within the dielectric member will decrease (e.g., to 60% or lower), in which case it would be difficult to widen the process condition range for generating plasma.

Herein, the dielectric member transmitting the microwaves of substantially a single mode includes a dielectric member that causes, when irradiated with microwaves of a single mode (e.g., TE (1, 0) mode), mode conversion of the microwaves within the dielectric member to radiate the microwaves of a single mode (e.g., TE (2, 1) mode) that differs from the mode of the incident microwaves.

In the plasma processing apparatus according to an aspect of the invention, the shape of the dielectric member in cross section in the direction approximately perpendicular to the transmitting direction is preferably approximately rectangular.

With this configuration, the dielectric member can reliably transmit the microwaves of substantially a single mode. Thus, the microwaves of the single mode can efficiently be used in the plasma generating process.

In the plasma processing apparatus according to an aspect of the invention, the dielectric member may allow transmission of microwaves of one of TE(n, 1) modes, where n and 1 are arbitrary integers.

With this configuration, the microwaves of the TE mode, the mode in which the electric field exists only in the cross section of the dielectric member in the direction approximately perpendicular to the transmitting direction, can be introduced into the processing chamber via the dielectric member. Uniform plasma can be generated efficiently using such microwaves of the TE mode.

In the plasma processing apparatus according to an aspect of the invention, the thickness T of the dielectric member in the transmitting direction may be approximately $((2m+1)/4)$ times the wavelength $\lambda$ of the microwaves of the single mode transmitted through the dielectric member.

With this configuration, it is possible to considerably improve the transmission efficiency of the microwaves in the dielectric member. Thus, it is reliably possible to widen the process condition range enabling plasma generation.

The plasma processing apparatus according to the aspect of the invention may be employed in a manufacturing process of a liquid crystal display device.

The processing apparatus according to another aspect of the present invention is a processing apparatus utilizing microwaves. It includes a dielectric member transmitting microwaves of substantially a single mode. The dielectric member has a thickness T in a transmitting direction of the microwaves therethrough that satisfies a condition of $(\lambda \times (2m+0.7)/4) \leq T \leq (\lambda \times (2m+1.3)/4)$, where $\lambda$ is a wavelength of the microwaves of the single mode transmitted through the dielectric member and m is an arbitrary integer.

With this configuration, transmission efficiency of the microwaves in the dielectric member can be increased sufficiently. Thus, in the case where the microwaves are introduced into the processing chamber of the processing apparatus via the dielectric member, for example, even if a microwave generator having performance of a conventional level is employed, the microwaves can be introduced into the processing chamber more efficiently than conventional. As a result, utilization efficiency of the microwaves at the time when processing utilizing the microwaves is performed in the processing chamber is improved.

Further, in the case where microwaves are used to generate plasma in the processing chamber, for example, the microwaves can be introduced into the processing chamber more efficiently according to the present invention than conventional. Thus, plasma can readily be generated under the condition where the pressure of the reactant gas for generating plasma within the processing chamber is reduced than conventional. Further, since transmission efficiency of the microwaves in the dielectric member is improved, plasma can be generated within the processing chamber even if the microwave power propagating in the dielectric member is decreased than conventional. Accordingly, it is possible to widen the range of process conditions such as the gas pressure and the microwave power enabling plasma generation compared to the conventional case.

In the processing apparatus according to the another aspect of the invention, the dielectric member may have a shape in cross section in a direction approximately perpendicular to the transmitting direction that allows transmission of the microwaves of substantially a single mode therethrough.

With this configuration, the shape in cross section of the dielectric member is optimized, so that a dielectric member capable of transmitting microwaves of substantially a single mode can readily be realized.

In the processing apparatus according to the another aspect of the invention, the shape of the dielectric member in cross section in the direction approximately perpendicular to the transmitting direction may be approximately rectangular.

This configuration essentially ensures that the microwaves of substantially a single mode are transmitted through the dielectric member. Thus, the microwaves of the single mode can effectively be used for a prescribed process such as a plasma generating process.

In the processing apparatus according to the another aspect of the invention, the dielectric member may allow transmission of microwaves of one of TE (n, 1) modes, where n and 1 are arbitrary integers.

Here, as described above, the TE (n, 1) mode of the microwaves corresponds to the mode where the electric field exists only in the cross section of the dielectric member in the direction approximately perpendicular to the transmitting direction of the microwaves through the dielectric member. In the processing apparatus of the present aspect, the microwaves of the TE mode can be introduced into the processing chamber through the dielectric member. When such microwaves of the TE mode are used for generating plasma, they can efficiently generate uniform plasma.

In the processing apparatus according to the another aspect of the invention, the thickness T of the dielectric member may be approximately $((2m+1)/4)$ times the wavelength $\lambda$ of the microwaves of the single mode.

This configuration can considerably improve the transmission efficiency of the microwaves in the dielectric member.

The processing apparatus of the present aspect may be configured to perform processing using plasma that is obtained by rendering a reactant gas a plasma state utilizing the microwaves transmitted through the dielectric member.

The processing apparatus of the present aspect may be used in a manufacturing process of a liquid crystal display device.

BEST MODES FOR CARRYING OUT THE INVENTION

Figure 1:
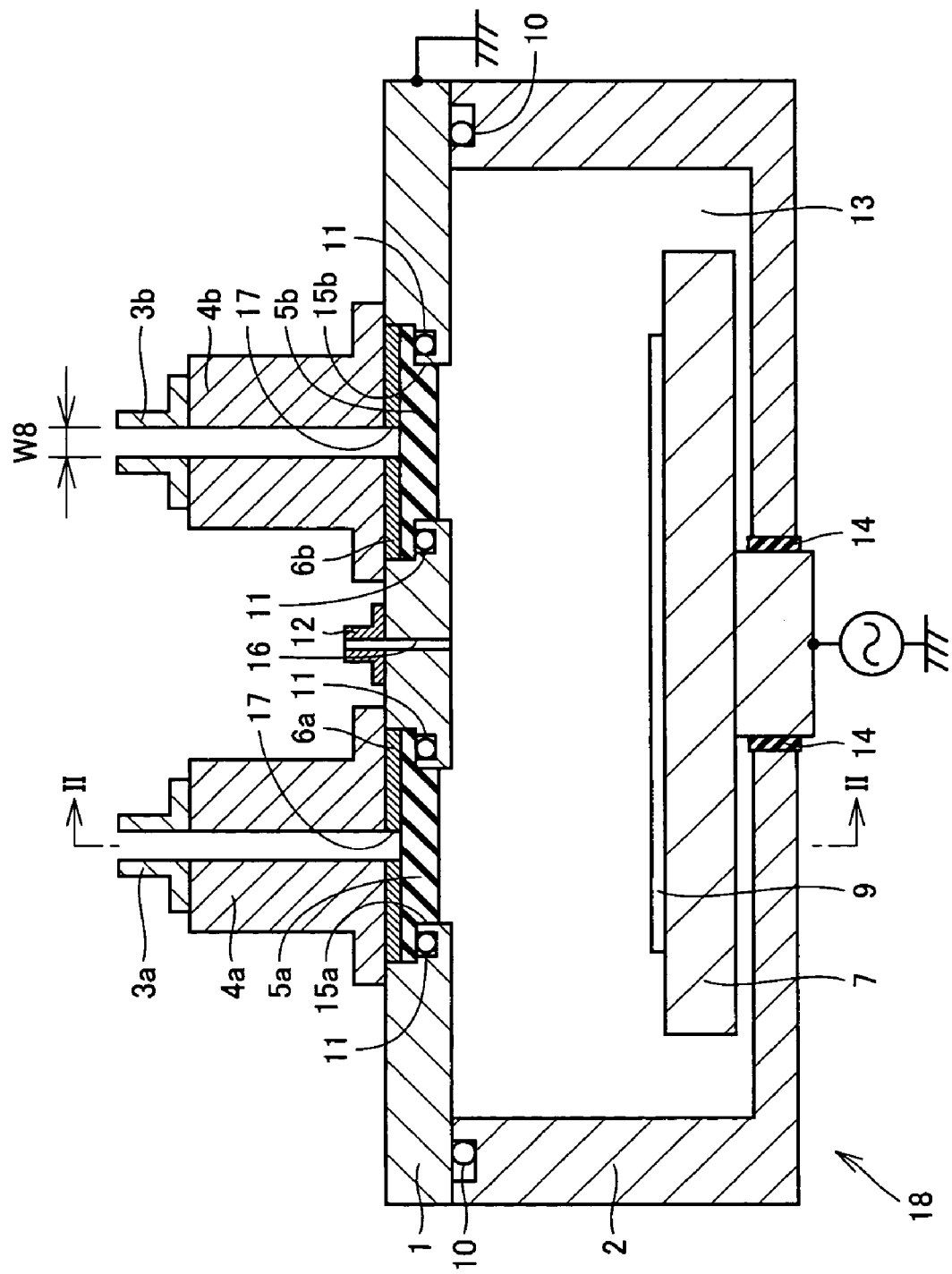
FIG. 1 is a schematic cross sectional view showing a first embodiment of a plasma processing apparatus according to the present invention.

Hereinafter, embodiments of the present invention will be described with reference to the drawings. In the drawings, the same reference characters denote the same or corresponding portions, and description thereof will not be repeated.

First Embodiment

The first embodiment of the plasma processing apparatus according to the present invention is now described with reference to FIGS. 1-3.

Figure 2:
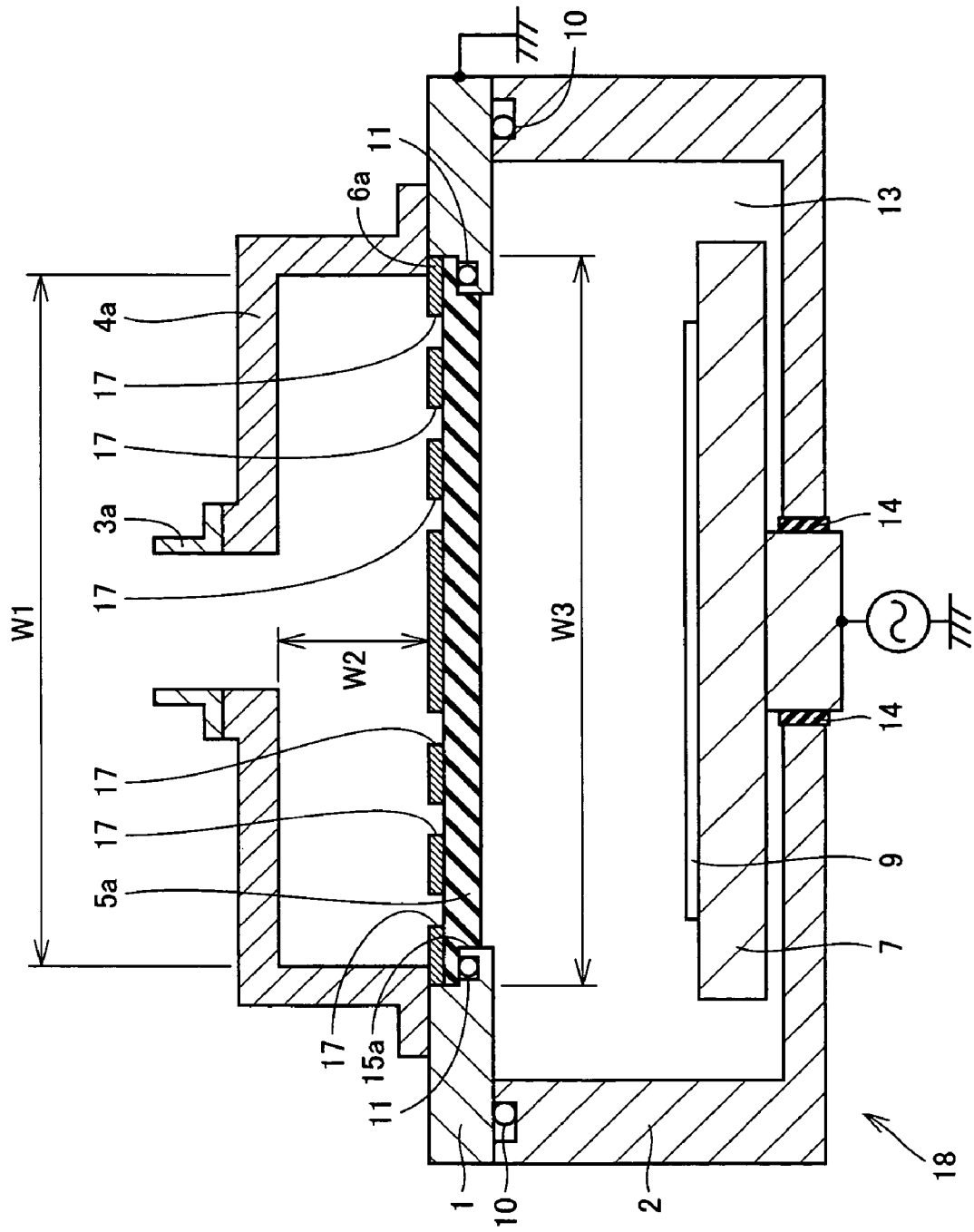
FIG. 2 is a schematic cross sectional view taken along the line II-II in FIG. 1.
Figure 3:
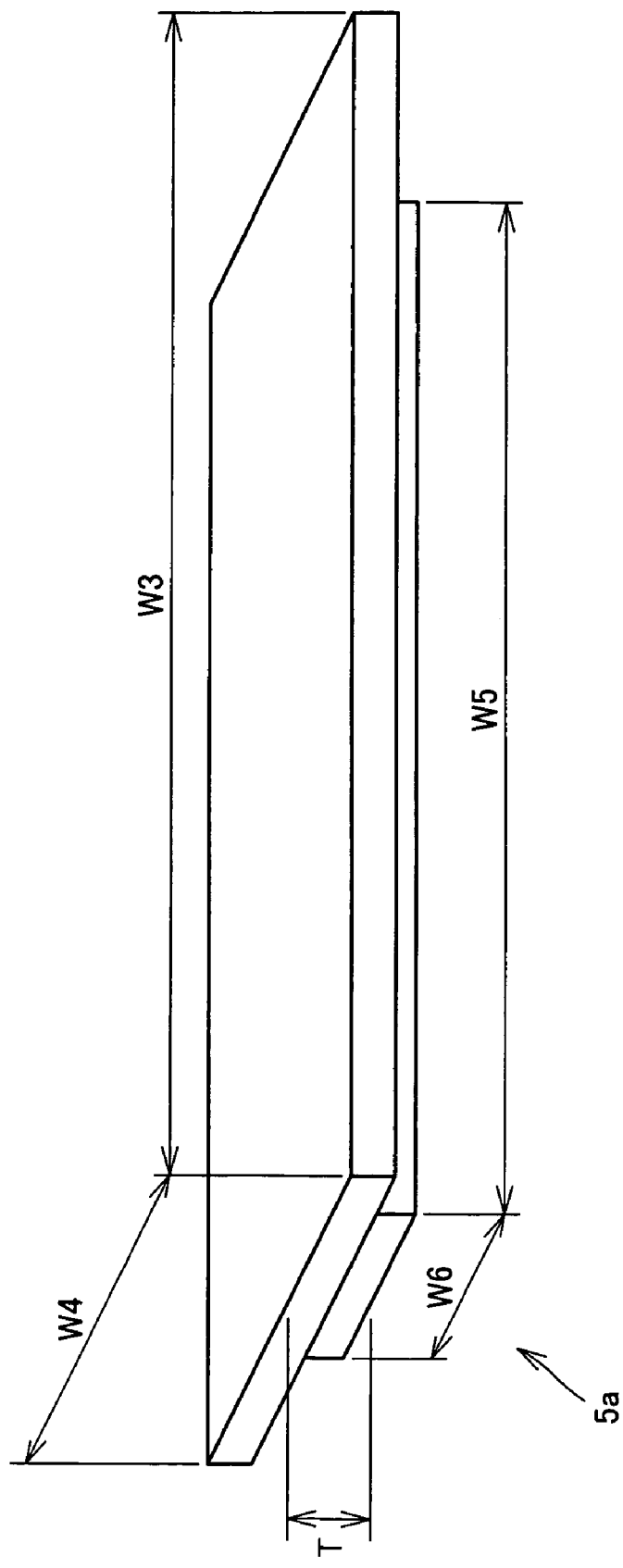
FIG. 3 is a schematic perspective view showing a shape of the dielectric used in the plasma processing apparatus shown in FIGS. 1 and 2.

Referring to FIGS. 1-3, the plasma processing apparatus 18 is a processing apparatus for performing plasma processing such as film deposition, etching or the like using plasma. Plasma processing apparatus 18 includes a process chamber body 2 made of a member of aluminum or aluminum having coating thereon, a chamber lid 1 arranged on top of process chamber body 2, lead-in waveguides 4a and 4b arranged on top of chamber lid 1, and waveguides 3a and 3b connected to lead-in waveguides 4a and 4b, respectively. Process chamber body 2 and chamber lid 1 constitute a chamber as the processing chamber. A substrate holder 7 for holding a substrate 9 to be processed is arranged in the chamber interior 13. Substrate holder 7 is made of a conductor such as a metal. A stand for supporting substrate holder 7 is provided beneath substrate holder 7. The stand is arranged to penetrate the bottom wall of process chamber body 2. An insulator 14 is arranged between the stand and process chamber body 2, to electrically insulate the process chamber body 2 from substrate holder 7 and the stand. Substrate holder 7 is electrically connected to a power source via the stand.

Chamber lid 1 is arranged to face the surface of substrate holder 7 on which substrate 9 is mounted. The gap between chamber lid 1 and process chamber body 2 is sealed with a gasket 10. Chamber lid 1 is provided with openings 15a and 15b, which are rectangular in two dimensions. Dielectrics 5a and 5b, each having a shape as shown in FIG. 3, are fixedly inserted in openings 15a and 15b, respectively. Dielectrics 5a, 5b are shaped to allow transmission of microwaves of substantially a single mode therethrough, as will be described later. Dielectrics 5a, 5b as the dielectric members may be formed, e.g., of silicon dioxide ($SiO_2$), aluminum oxide ($Al_2O_3$), or aluminum nitride (AlN).

Gaskets 11 are arranged at the interfaces between chamber lid 1 and respective dielectrics 5a, 5b for sealing. Such arrangement of gaskets 10, 11 ensures air-tightness of chamber interior 13 by separating the same from the outside of plasma processing apparatus 18. A vacuum pump (not shown) connected to process chamber body 2 may be used to evacuate chamber interior 13 to hold it in a vacuum state at a pressure on the order of $10^{-4}$ Pa to $10^{-5}$ Pa.

Slot antenna plates 6a and 6b, each having a plurality of slots 17 formed therein, are arranged on dielectrics 5a and 5b, respectively. Lead-in waveguides 4a and 4b are arranged on slot antenna plates 6a and 6b, respectively. A magnetron as a microwave generator, not shown, is connected to waveguides 3a, 3b. The magnetron and waveguides 3a, 3b are connected via an isolator, an automatic matching device, and waveguides of prescribed shapes, such as straight waveguide, corner waveguide, tapered waveguide, branched waveguide and others. The isolator, automatic matching device and various waveguides as a whole constitute a microwave circuit. The magnetron, microwave circuit, waveguides 3a, 3b, lead-in waveguides 4a, 4b, slot antenna plates 6a, 6b and dielectrics 5a, 5b constitute microwave introduction means. Adjusting shapes and dimensions of the components of the microwave circuit allows microwaves of a single mode, such as TE (1, 0) mode, to propagate through waveguides 3a, 3b.

A gas inlet 16 is formed at a portion of chamber lid 1 between openings 15a and 15b, to penetrate chamber lid 1. A gas supply tube 12 is arranged on the upper surface of chamber lid 1 to be connected to gas inlet 16. Although not shown, gas supply tube 12 is connected to a tank of a reactant gas or a process gas, and further connected to a supply pump for supplying the gas to chamber interior 13 at a prescribed flow rate. Chamber lid 1 is grounded. Further, chamber lid 1, process chamber body 2, substrate holder 7 and others are provided with temperature control members, such as heating and/or cooling systems, to keep the respective members at prescribed temperatures.

An operation of plasma processing apparatus 18 shown in FIGS. 1-3 is now described in brief. Initially, the magnetron, not shown, oscillates microwaves at a frequency of 2.45 GHz, for example. The microwaves are propagated through the microwave circuit formed of the isolator, automatic matching device, straight waveguide and others, to waveguides 3a, 3b. The microwaves propagated to waveguides 3a, 3b are of a single mode such as TE (1, 0) mode. Lead-in waveguides 4a, 4b have their sizes (width W1, height W2 and others) selected appropriately to convert the microwaves of the relevant mode to microwaves of another single mode such as TE (m, 0) mode (m is an integer). The mode-converted microwaves are then introduced via slots 17 of slot antenna plates 6a, 6b to dielectrics 5a, 5b.

Dielectrics 5a, 5b are shaped to allow transmission of microwaves of substantially a single mode therethrough. More specifically, in plasma processing apparatus 18 shown in FIGS. 1-3, dielectrics 5a, 5b each have a rectangular shape when its upper surface is seen from the upper surface side of chamber lid 1, and also have a rectangular shape in cross section in a direction approximately perpendicular to the incident direction of the microwaves (or in a direction approximately parallel to the upper surface of chamber lid 1). Thus, the microwaves of a single mode can be used efficiently in the plasma generating process.

The thickness T of each of dielectrics 5a, 5b is set to approximately ((2 n+1)/4) times (n is an integer) the wavelength λg of the microwaves of the single mode propagated through and radiated from dielectrics 5a, 5b. Thickness T of dielectrics 5a, 5b preferably satisfies the condition of (λg·(2 n+0.7)/4)≦T≦(λg·(2 n+1.3)/4).

The microwaves introduced via slots 17 into dielectrics 5a, 5b are converted inside dielectrics 5a, 5b into microwaves of substantially a single mode of TE (m1, n1) mode (m1 and n1 are integers). The microwaves of substantially a single mode are radiated from the lower surfaces of dielectrics 5a, 5b to chamber interior 13. Such microwaves of substantially single TE mode are suitable for generating uniform plasma.

The inventors have found that radiant efficiency of the microwaves radiated to chamber interior 13 can be increased when the mode of the microwaves in dielectrics 5a, 5b is substantially a single mode and when thickness T of each of dielectrics 5a, 5b is set as described above. That is, by setting thickness T of dielectrics 5a, 5b as described above, the nodes of the standing waves of the microwaves can be positioned at the upper surfaces (facing the atmosphere) of dielectrics 5a, 5b, and the antinodes of the standing waves can be positioned at the lower surfaces (facing chamber interior 13 held in a vacuum state) of dielectrics 5a, 5b. In doing so, transmission efficiency of the microwaves transmitted through dielectrics 5a, 5b can be improved, and accordingly, radiant efficiency of the microwaves radiated to chamber interior 13 can be increased.

A reactant gas for use in plasma processing is introduced from the tank via gas supply tube 12 and gas inlet 16 into chamber interior 13. With the pressure of chamber interior 13 adjusted to a prescribed value, the microwaves are introduced via dielectrics 5a, 5b into chamber interior 13 as described above. As a result, plasma is generated in chamber interior 13, which can be used to perform film deposition, etching or the like on the surface of substrate 9.

At this time, radiant efficiency of the microwaves introduced from dielectrics 5a, 5b to chamber interior 13 is higher than conventional, so that it is possible to cause discharge in chamber interior 13 even if the pressure of the reactant gas in chamber interior 13 or the microwave power is lower than in the case of using a conventional plasma processing apparatus. As a result, the plasma can be generated in chamber interior 13 even under the conditions of lower gas pressure and/or lower microwave power than conventional. This means that the process condition range enabling plasma generation is widened.

The structure of the microwave introducing portion in the plasma processing apparatus shown in FIGS. 1-3 is now described in more detail. Referring to FIGS. 1-3, waveguides 3a, 3b each have a shape in cross section that allows propagation of microwaves of only the TE (1, 0) mode, like a JIS-defined waveguide. Lead-in waveguides 4a, 4b each have an opening at the center of its upper surface, which is connected to corresponding one of waveguides 3a, 3b. Lead-in waveguides 4a, 4b function as mode converters that convert the microwaves of the TE (1, 0) mode introduced from waveguides 3a, 3b into microwaves of the TE (7, 0) mode.

In each of lead-in waveguides 4a, 4b, a distance W1 between the inner sidewalls in its longitudinal direction may be, e.g., 530 mm, and a distance W8 between the inner sidewalls in a direction perpendicular to the longitudinal direction may be 16 mm, for example. A distance W2 from the upper surface of each of slot antenna plates 6a, 6b located beneath lead-in waveguides 4a, 4b to the upper inner wall surface of the relevant lead-in waveguide may be, e.g., 100 mm.

Slot antenna plates 6a, 6b arranged beneath lead-in waveguides 4a, 4b each have six slots 17, although the number and arrangement of slots 17 may arbitrarily be changed to conform to a process condition or the like.

Dielectrics 5a and 5b are arranged beneath slot antenna plates 6a and 6b, respectively. Dielectrics 5a, 5b each have a shape as shown schematically in FIG. 3. Specifically, referring to FIG. 3, dielectric 5a has an upper surface extending in a direction approximately perpendicular to the radiating direction of the microwaves, which may have a length W3 of, e.g., 580 mm and a width W4 of, e.g., 110 mm. Further, dielectric 5a has a surface facing chamber interior 13, which may have a length W5 of, e.g., 551 mm and a width W6 of, e.g., 81 mm. Dielectric 5b has a shape approximately the same as that of dielectric 5a. As seen from FIGS. 1-3, dielectrics 5a, 5b each have an inverted convex shape in cross section in a direction parallel to the radiating direction of the microwaves.

In dielectrics 5a, 5b permitting transmission of microwaves of a single mode therethrough as shown in FIGS. 1-3, if their thickness T is set to ((2 n+1)/4) times (n is an integer) the wavelength of the microwaves inside dielectrics 5a, 5b as described above, then plasma can be generated sufficiently even when the pressure of the reactant gas or the power of the plasma is lower than conventional. According to the inventors' investigation, it is considered that setting thickness T of dielectrics 5a, 5b as described above can logically be explained as follows.

In plasma processing apparatus 18 shown in FIGS. 1-3, it is considered, from the shape of the plane of each of dielectrics 5a, 5b approximately perpendicular to the radiating direction of the microwaves (i.e., the shape of the upper surface of each of dielectrics 5a, 5b or the shape of the cross section approximately perpendicular to the microwave radiating direction), that the microwaves of a single mode substantially corresponding to the TE (7, 1) mode propagate through dielectrics 5a, 5b. At this time, the wavelength of the microwaves within the dielectrics can be obtained from the following expression 1 that is a logical expression of rectangular waveguide.

$$\lambda_g = (\lambda/SQRT(\in_r))/SQRT\{1-(\lambda/SQRT(\in_r))^2/2\times((7/L1)^2+(1/L2)^2)\} \quad \text{(expression 1)}$$

where $\lambda_g$: wavelength of microwaves within the rectangular dielectric;

λ: wavelength of microwaves propagating in a free space in the air or a vacuum;

$\in_r$: relative dielectric constant of dielectric;

L1: length of longer side of dielectric; and

L2: length of shorter side of dielectric.

Here, provided that dielectrics 5a, 5b are made of aluminum oxide ($Al_2O_3$) and the relative dielectric constant of dielectrics 5a, 5b is 9 when the frequency of the microwaves is 2.45 GHz, the wavelength of the microwaves of the TE (6, 1) mode inside dielectrics 5a, 5b is 44.8 mm from the above expression 1. When thickness T of each of dielectrics 5a, 5b in a direction along which the microwaves are transmitted therethrough is set to a value corresponding to ((2 n+1)/4) times (n is an integer) the wavelength of the microwaves, the radiant efficiency of the microwaves can be increased, as described above.

That is, thickness T of each of dielectrics 5a, 5b can be set to about 11.2 mm or about 33.6 mm, for example, which corresponds to ((2 n+1)/4) times the wavelength (44.8 mm) of the microwaves, to increase transmission efficiency of the microwaves in dielectrics 5a, 5b. The transmission efficiency of the microwaves in dielectrics 5a, 5b was low when dielectrics 5a, 5b were each formed to have thickness T of approximately 22.4 mm, which corresponds to (n/2) times (n is an integer) the wavelength of the microwaves.

Figure 4:
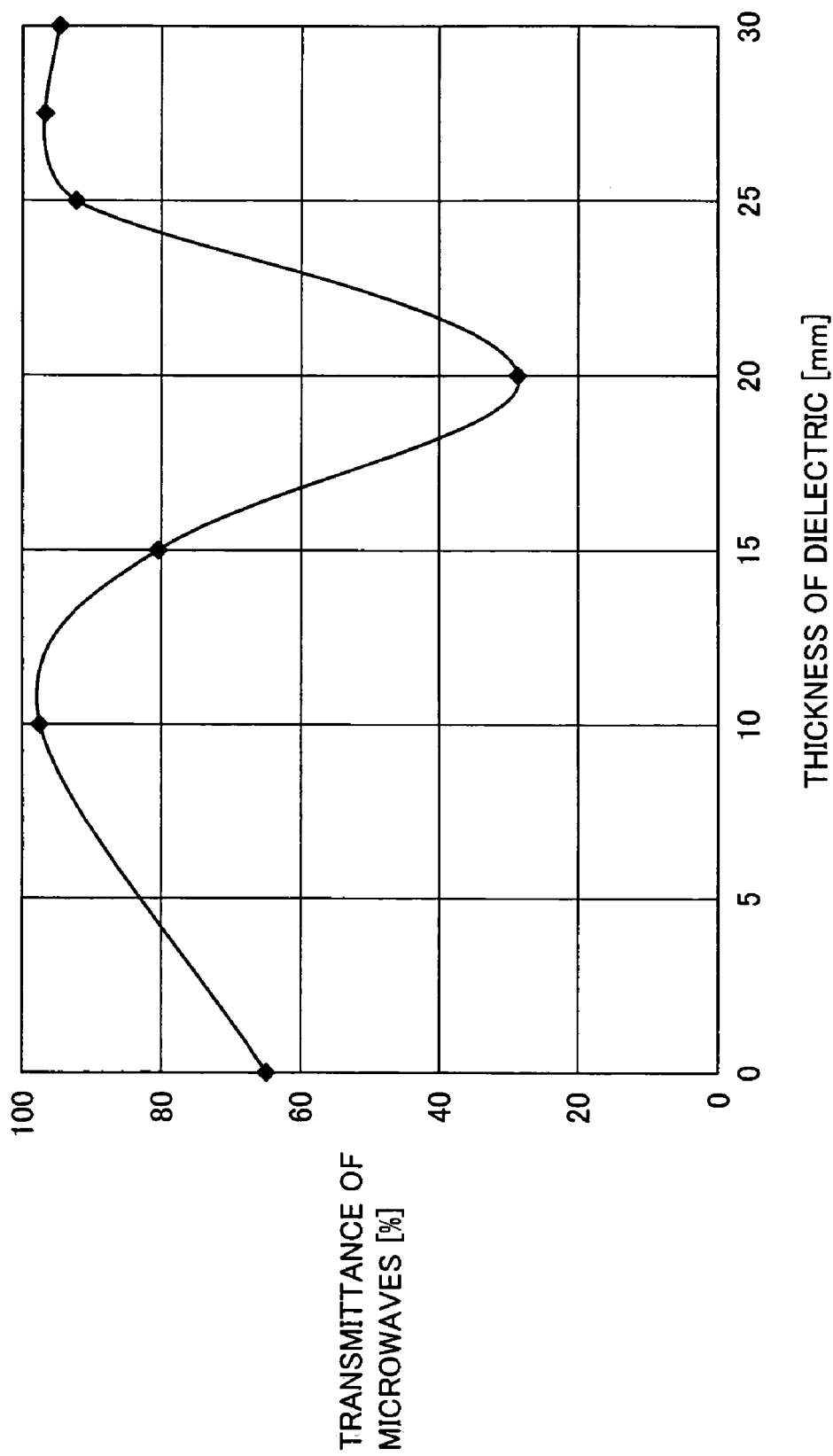
FIG. 4 is a graph showing the relation between a thickness of the dielectric and transmittance of the microwaves.

The inventors obtained through simulation the relation between thickness T of dielectrics 5a, 5b in the microwave radiating direction and the microwave transmission efficiency (microwave transmittance) in dielectrics 5a, 5b, taking account of the shapes of waveguides 3a, 3b and lead-in waveguides 4a, 4b in the plasma processing apparatus shown in FIGS. 1-3 as well. The results are shown in FIG. 4. The data shown in FIG. 4 correspond to the case where the wavelength of the microwaves within dielectrics 5a, 5b is 44.8 mm as described above.

As seen from FIG. 4, the microwave transmittance shows a maximum value when thickness T of dielectrics 5a, 5b is approximately ((2 n+1)/4) times (n is an integer) the wavelength $\lambda_g$ of the microwaves in dielectrics 5a, 5b (specifically, when thickness T of dielectrics 5a, 5b is about 11.2 mm or about 33.6 mm). As also seen from FIG. 4, the microwave transmittance is sufficient large, about 60% or more, when thickness T of the dielectrics satisfies the condition of ($\lambda_g$ (2 n+0.7)/4)≦T≦($\lambda_g$ (2 n+1.3)/4).

All that is needed for each of dielectrics 5a, 5b in plasma processing apparatus 18 shown in FIGS. 1-3 is that it has a rectangular shape in two dimensions (in cross section approximately perpendicular to the microwave propagating direction). The cross section of each of dielectrics 5a, 5b in a direction approximately parallel to the microwave radiating direction may be of a rectangular shape, rather than the inverted convex shape as shown in FIGS. 1-3, with which the similar effects as in the plasma processing apparatus of FIGS. 1-3 can also be obtained.

The correlation between the thickness and the microwave transmittance of the dielectric as described above is applicable to a dielectric having a shape different from that of each of dielectrics 5a, 5b shown in FIGS. 1-3. For example, the present invention is applicable to the case where the shape of each of dielectrics 5a, 5b in two dimensions is other than a rectangular form, which may be a circular form. That is, radiant efficiency of the microwaves can be increased, even if dielectrics 5a, 5b each have a round shape in two dimensions, by setting the thickness of the dielectrics as described above, as long as the two-dimensional shape of each of dielectrics 5a, 5b allows propagation of microwaves of substantially a single mode such as TM (n, 1) mode (n and 1 are integers).

More specifically, thickness T of the dielectric in a direction parallel to the microwave radiating direction is set to no lower than ((2 n+0.7)/4) times and no greater than ((2 n+1.3)/4) times (n is an integer), or more preferably approximately ((2 n+1)/4) times (n is an integer), the wavelength $\lambda_g$ of the above-described microwaves of a single mode propagating in the dielectric. In doing so, transmittance of the microwaves in the dielectric can be increased. As a result, it is possible to widen the process condition range enabling plasma generation in chamber interior 13.

Further, when substrate 9 to be processed in plasma processing apparatus 18 is a large rectangular substrate, a plurality of rectangular dielectrics may be arranged at chamber lid 1 to face substrate 9. In this case, the plurality of rectangular dielectrics can readily be arranged at chamber lid 1 to conform to the size and shape of substrate 9. As such, it is possible to effectively generate plasma in a region opposite to substrate 9.

Although slot antenna plates 6a, 6b have been used in plasma processing apparatus 18 shown in FIGS. 1-3, the present invention is applicable to a plasma processing apparatus unprovided with slot antenna plates 6a, 6b. If lead-in waveguides 4a, 4b and dielectrics 5a, 5b serve as the so-called mode converters and if the dielectrics each have a shape allowing propagation of microwaves of substantially a single mode therethrough, then thickness T of dielectrics 5a, 5b in the microwave radiating direction is set to no lower than ((2 n+0.7)/4) times and no greater than ((2 n+1.3)/4) times (n is an integer) the wavelength $\lambda_g$ of the microwaves of the single mode propagating in the dielectrics, as described above. In doing so, transmittance of the microwaves in dielectrics 5a, 5b is increased, and accordingly, the range of process conditions enabling plasma generation in chamber interior 13 can be widened.

Further, although microwaves having a frequency of 2.45 GHz are radiated from the magnetron as the microwave source in plasma processing apparatus 18 shown in FIGS. 1-3, the frequency of the microwaves used is not limited to 2.45 GHz. The present invention is applicable to the case where the wavelength of the microwaves used is small compared to the size of the chamber formed of process chamber body 2 and chamber lid 1 in plasma processing apparatus 18.

Second Embodiment

The second embodiment of the plasma processing apparatus according to the present invention is now described with reference to FIG. 5, which corresponds to FIG. 2.

Figure 5:
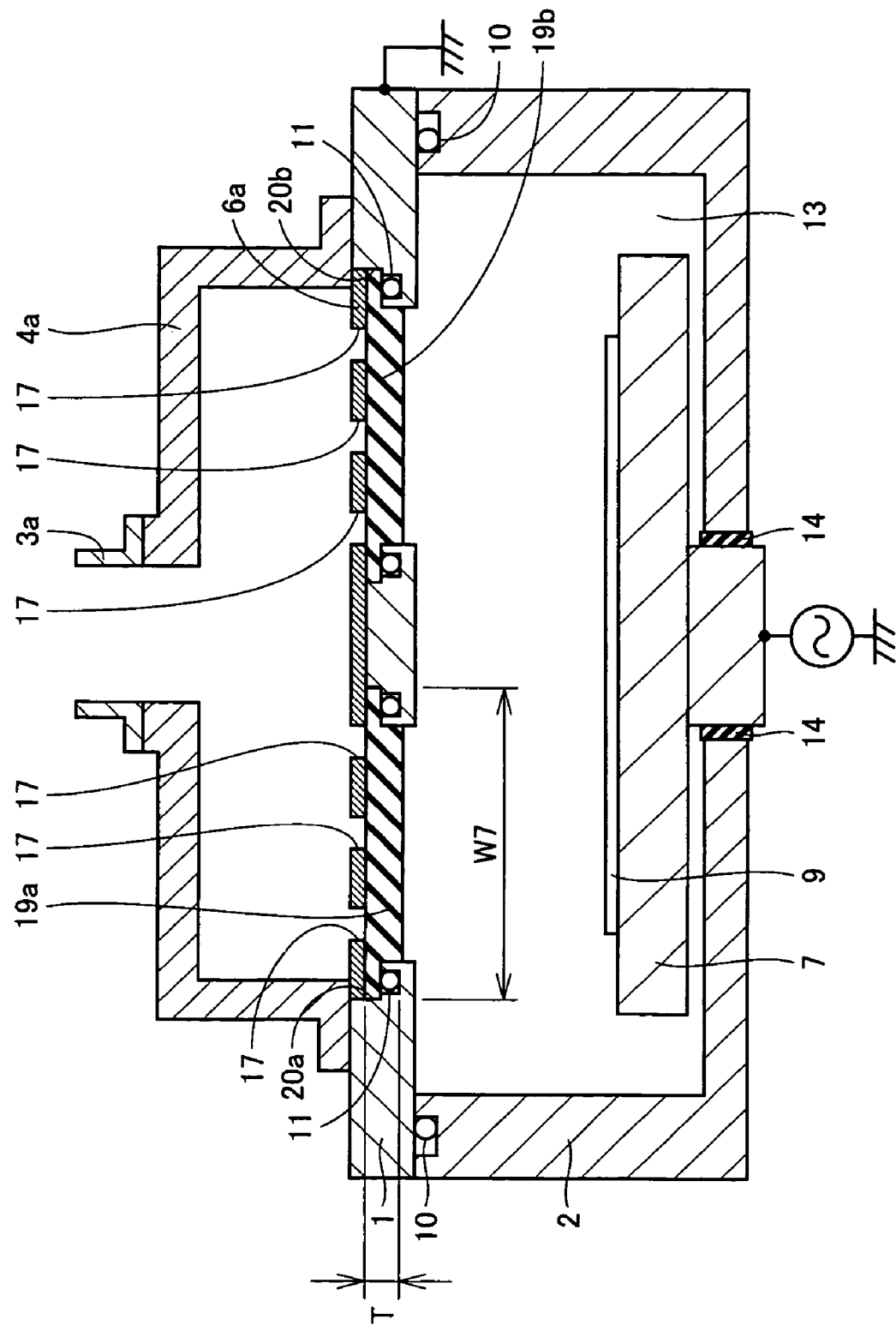
FIG. 5 is a schematic cross sectional view showing a second embodiment of a plasma processing apparatus according to the present invention.

Referring to FIG. 5, the plasma processing apparatus 18 has a structure basically similar to that of the plasma processing apparatus shown in FIGS. 1-3, except for the number and arrangement of dielectrics 19a, 19b. In plasma processing apparatus 18 shown in FIG. 5, two openings 20a, 20b are formed at chamber lid 1 in a region beneath lead-in waveguide 4a, along a longitudinal direction of lead-in waveguide 4a. Dielectrics 19a and 19b are fitted in openings 20a and 20b, respectively. Dielectrics 19a, 19b each have a rectangular shape in cross section in a direction approximately perpendicular to the microwave radiating direction. Similarly, two openings are formed at chamber lid 1 beneath lead-in waveguide 4b (see FIG. 1). Dielectrics having identical shapes to those of dielectrics 19a, 19b of FIG. 5 are fitted into the two openings as well.

An upper surface of each of dielectrics 19a, 19b may have a length W7 of, e.g., 283 mm in a direction approximately parallel to a longitudinal direction of lead-in waveguide 4a. Dielectrics 19a, 19b may each have a width of 80 mm, for example, in a direction perpendicular to the longitudinal direction of lead-in waveguide 4a. The cross section of each of dielectrics 19a, 19b in a direction parallel to the microwave radiating direction has approximately an inverted convex shape, as seen from FIG. 5.

Figure 6:
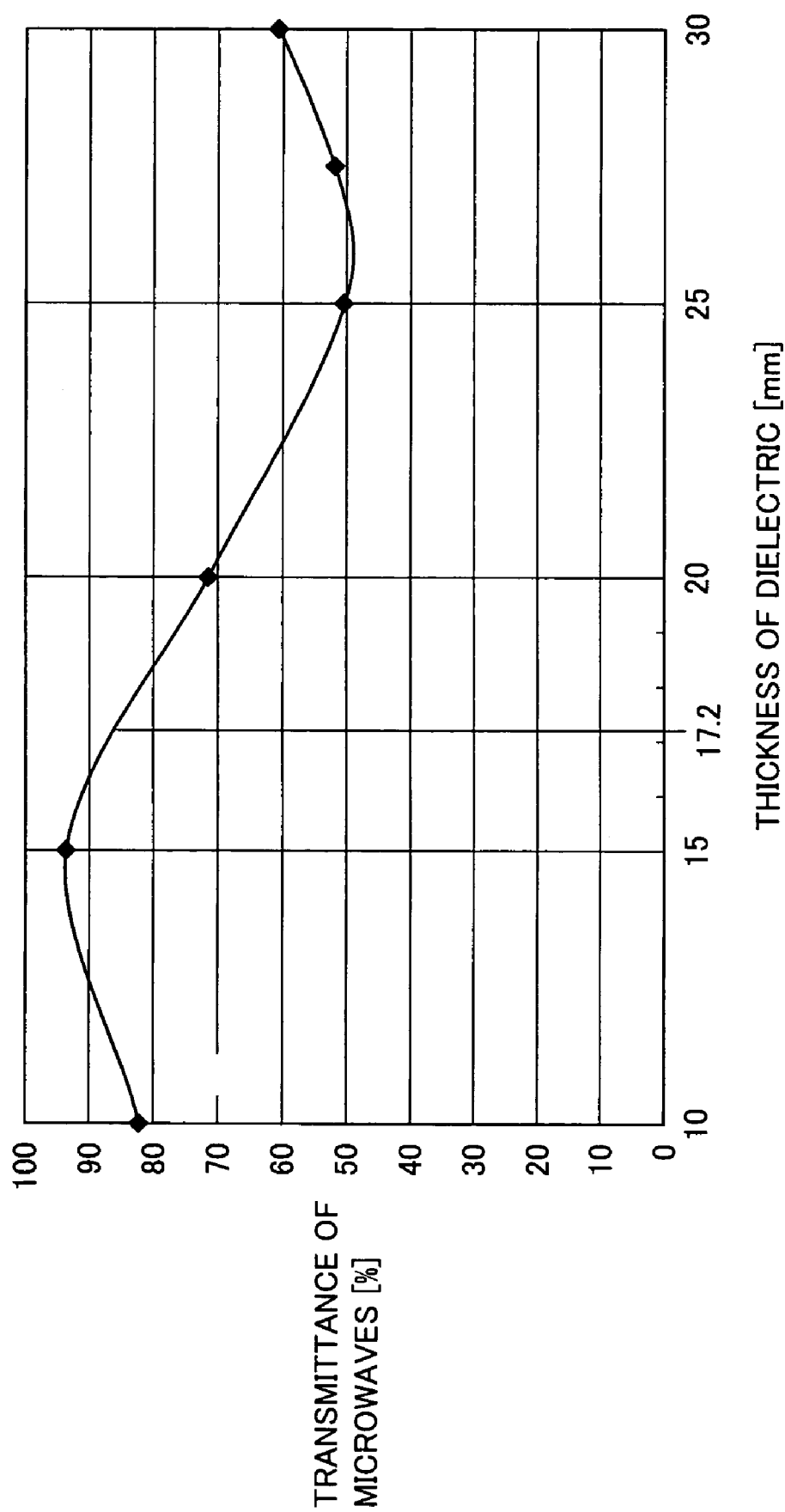
FIG. 6 is a graph showing the relation between a thickness of the dielectric and transmittance of the microwaves transmitted through the dielectric and radiated into a chamber in the plasma processing apparatus shown in FIG. 5.

In the plasma processing apparatus shown in FIG. 5, again, the relation between thickness T of dielectrics 19a, 19b and microwave transmittance was obtained in simulation, as in the case of the first embodiment of the present invention. The results are shown in FIG. 6. Dielectrics 19a, 19b simulated each had a two-dimensional shape (cross section) enabling propagation of microwaves of substantially TE (7, 1) mode in a direction approximately perpendicular to the microwave radiating direction.

Using the above-described expression 1, the wavelength of the microwaves of TE (7, 1) mode in dielectrics 19a, 19b is 68.9 mm. As seen from the graph shown in FIG. 6, transmittance of the microwaves becomes sufficiently large when thickness T of dielectrics 19a, 19b is set to 17.2 mm, which corresponds to (¼) times (¼ wavelength) the wavelength $\lambda_g$ of the microwaves propagating in dielectrics 19a, 19b (i.e., in the case where n=0 when thickness T of the dielectrics is set to ((2 n+1)/4) times the wavelength $\lambda_g$ of the microwaves).

EXAMPLES

To confirm the simulated results in the second embodiment described above, two kinds of samples of dielectrics, having thicknesses T of 15.0 mm and 27.5 mm respectively, were prepared as dielectrics 19a, 19b in the plasma processing apparatus shown in FIG. 5. The dielectric samples were placed in plasma processing apparatus 18 separately, and breakdown voltage values were measured. For simulation of the reactant gas, an argon (Ar) gas was supplied to chamber interior 13 at a flow rate of 500 sccm (0.5 l/min) to cause discharge. The results are shown in FIG. 7.

Figure 7:
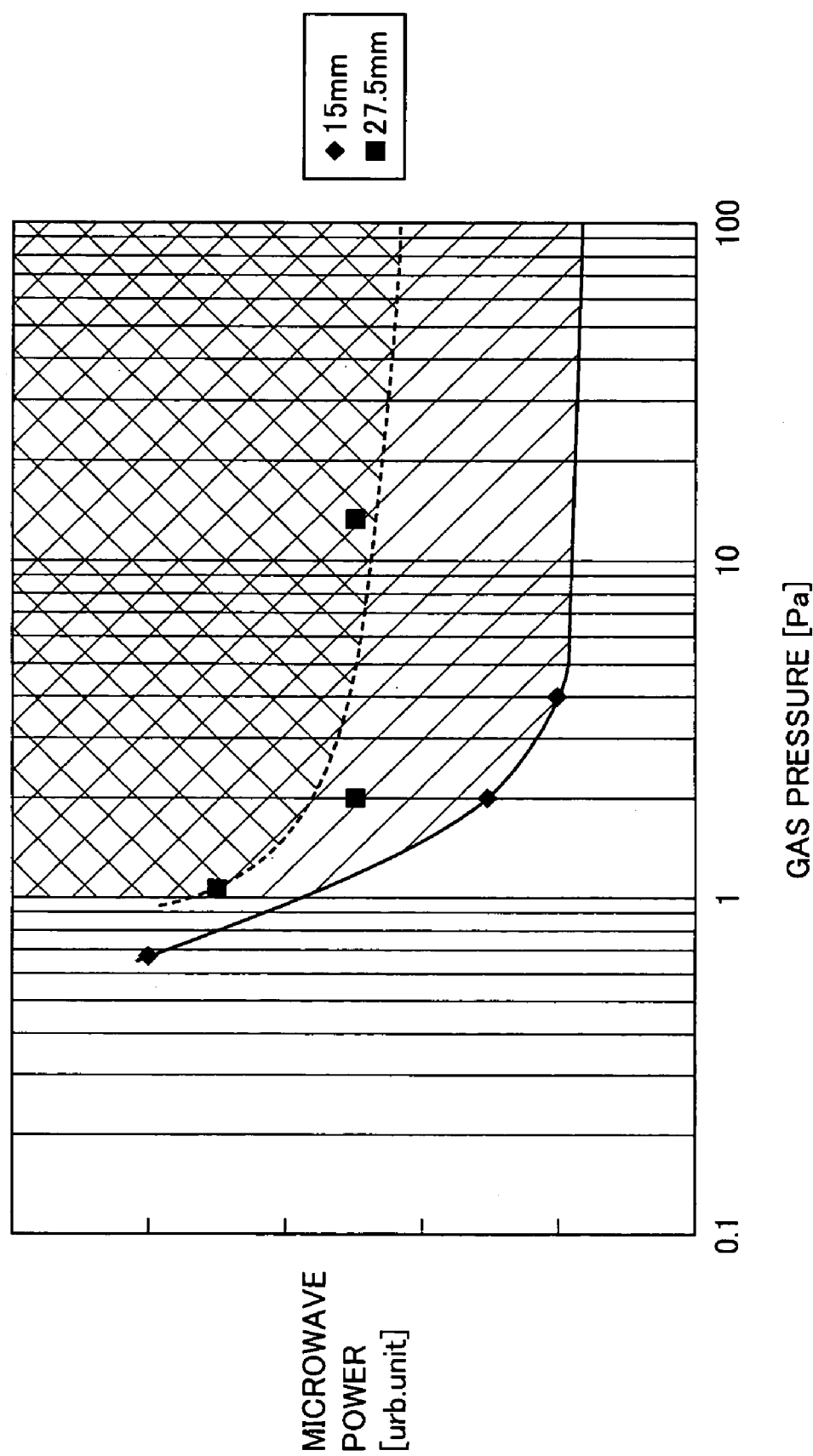
FIG. 7 is a graph showing discharge ranges of dielectric samples of different thicknesses.

Referring to FIG. 7, the horizontal axis represents a gas pressure of the chamber interior, and the vertical axis represents a microwave power. The solid line represents the lower limit of discharge range (condition range enabling plasma generation) when thickness T of dielectrics 19a, 19b is 15.0 mm. The broken line represents the lower limit of discharge range when thickness T of dielectrics 19a, 19b is 27.5 mm.

It is seen from FIG. 7 that discharge can be caused in a region of lower gas pressure and smaller microwave power in the case where the dielectric sample having thickness T of 15.0 mm is employed than in the case where the dielectric sample having thickness T of 27.5 mm is employed. This means that the process condition range enabling plasma generation can be widened when thickness T of dielectrics 19a, 19b is set to 15.0 mm.

The value 15.0 mm of thickness T of the dielectric sample falls within the numerical range corresponding to no lower than ((2 n+0.7)/4) times and no greater than ((2 n+1.3)/4) times (n is an integer) the wavelength $\lambda_g$ of 68.9 mm of the microwaves within the dielectrics. Specifically, the value of 15.0 mm falls within the above numerical range when n is 0. The value 27.5 mm of thickness T of the other dielectric sample does not fall within the above-described numerical range.

As described above, in the plasma processing apparatus shown in FIG. 5, again, transmittance of the microwaves transmitted through dielectrics 19a, 19b can be improved when thickness T of dielectrics 19a, 19b is set to no lower than ((2 n+0.7)/4) times and no greater than ((2 n+1.3)/4) times (n is an integer) the wavelength $\lambda_g$ of the microwaves of a single mode propagating in the dielectrics. Accordingly, the discharge range of plasma (range of process conditions enabling plasma generation) in chamber interior 13 can be widened.

It should be understood that the embodiments and examples disclosed herein are illustrative and non-restrictive in every respect. The scope of the present invention is defined by the terms of the claims, rather than the description above, and is intended to include any modifications within the scope and meaning equivalent to the terms of the claims.

INDUSTRIAL APPLICABILITY

As described above, the plasma processing apparatus and the processing apparatus according to the present invention can be used in a manufacturing process of a semiconductor device such as a semiconductor memory device or a liquid crystal display device, and is particularly suitable for processing a large-area substrate.

The invention claimed is:

1. A plasma processing apparatus having
a processing chamber for performing processing using plasma therein and
microwave introduction means for introducing microwaves into said processing chamber to cause a reactant gas supplied in said processing chamber to attain a plasma state, wherein
said microwave introduction means includes a dielectric member transmitting said microwaves,
each said dielectric member having a shape in cross section in a direction approximately perpendicular to a transmitting direction of said microwaves through said dielectric member that allows transmission of said microwaves of substantially a single mode, and
each said dielectric member having a thickness T in said transmitting direction that satisfies a condition of ($\lambda \times$(2 m+0.7)/4)$\leq$T$\leq$($\lambda \times$(2 m+1.3)/4), where $\lambda$ is a wavelength of said microwaves of the single mode transmitted through said dielectric member and m is an arbitrary integer,
wherein the wavelength of the microwaves of the single mode is, $$\lambda = (\lambda_0/SQRT(\in_r))/SQRT\{1-(\lambda_0/SQRT(\in_r))^2/2 \times ((7/L1)^2+(1/L2)^2)\}$$

where
$\lambda_0$: wavelength of the microwaves propagating in a free space in the air or a vacuum;
$\in_r$: relative dielectric constant of the dielectric member;
L1: length of the longer side of the dielectric member in cross section; and
L2: length of shorter side of the dielectric member in cross section,
wherein said microwave introduction means also includes slot antenna plates attached on a side of each said dielectric member that is opposite from the processing chamber,
wherein a side of each said dielectric that faces the processing chamber is arranged to face a substrate located in the processing chamber such that at least one slot of the respective slot antenna plate is in a direct path of microwaves transmitted to said substrate, said substrate thereby being the subject of said processing.

2. The plasma processing apparatus according to claim 1, wherein the shape of said dielectric member in cross section in the direction approximately perpendicular to said transmitting direction is approximately rectangular.

3. The plasma processing apparatus according to claim 1, wherein the thickness T of said dielectric member in said transmitting direction is approximately ((2 m+1)/4) times the wavelength $\lambda$ of said microwaves of the single mode transmitted through said dielectric member.

4. A processing apparatus utilizing microwaves, comprising a plurality of dielectric member transmitting microwaves of substantially a single mode, wherein
each said dielectric member has a thickness T in a transmitting direction of said microwaves through said dielectric member that satisfies a condition of ($\lambda \times$(2 m+0.7)/4)$\leq$T$\leq$($\lambda \times$(2 m+1.3)/4), where $\lambda$ is a wavelength of said microwaves of the single mode transmitted through said dielectric member and m is an arbitrary integer,
wherein the wavelength of the microwaves of the single mode is, $$\lambda = (\lambda_0/SQRT(\in_r))/SQRT\{1-(\lambda_0/SQRT(\in_r))^2/2 \times ((7/L1)^2+(1/L2)^2)\}$$

where $\lambda_0$: wavelength of the microwaves propagating in a free space in the air or a vacuum;

$\in_r$: relative dielectric constant of the dielectric member;

L1: length of the longer side of the dielectric member in cross section; and

L2: length of shorter side of the dielectric member in cross section, wherein said processing apparatus comprises slot antenna plates arranged on a surface of the respective dielectric member, wherein an opposite side of each said dielectric member from the side having the slot antenna plate is arranged to face a substrate, the substrate being processed using the microwaves being transmitted in a direct path including a slot of the slot antenna plate.

5. The processing apparatus according to claim 4, wherein each said dielectric member has a shape in cross section in a direction approximately perpendicular to said transmitting direction that allows transmission of said microwaves of substantially a single mode therethrough.

6. The processing apparatus according to claim 5, wherein the shape of said dielectric member in cross section in the direction approximately perpendicular to said transmitting direction is approximately rectangular.

7. The processing apparatus according to claim 4, wherein the thickness T of said dielectric member is approximately ((2 m+1)/4) times the wavelength $\lambda$ of said microwaves of the single mode.

* * * * *